United States Patent
Murakami et al.

(10) Patent No.: US 11,670,566 B2
(45) Date of Patent: Jun. 6, 2023

(54) THERMAL INTERFACE MATERIAL, METHOD FOR THERMALLY COUPLING WITH THERMAL INTERFACE MATERIAL, AND METHOD FOR PREPARING THERMAL INTERFACE MATERIAL

(71) Applicant: KANEKA CORPORATION, Osaka (JP)

(72) Inventors: Mutsuaki Murakami, Osaka (JP); Atsushi Tatami, Osaka (JP); Masamitsu Tachibana, Osaka (JP)

(73) Assignee: KANEKA CORPORATION, Osaka (JP)

( * ) Notice: Subject to any disclaimer, the term of this patent is extended or adjusted under 35 U.S.C. 154(b) by 855 days.

(21) Appl. No.: 16/483,391

(22) PCT Filed: Jan. 30, 2018

(86) PCT No.: PCT/JP2018/002957
§ 371 (c)(1),
(2) Date: Aug. 2, 2019

(87) PCT Pub. No.: WO2018/143190
PCT Pub. Date: Aug. 9, 2018

(65) Prior Publication Data
US 2020/0013695 A1    Jan. 9, 2020

(30) Foreign Application Priority Data
Feb. 2, 2017  (JP) .............................. JP2017-017697

(51) Int. Cl.
*C01B 32/205*    (2017.01)
*H01L 23/373*    (2006.01)
(Continued)

(52) U.S. Cl.
CPC ........ *H01L 23/3735* (2013.01); *C01B 32/205* (2017.08); *C09J 7/29* (2018.01); *C09J 201/00* (2013.01); *H05K 7/20* (2013.01)

(58) Field of Classification Search
CPC ....... B32B 9/007; C01B 32/20; C01B 32/205; C01B 32/21
See application file for complete search history.

(56) References Cited

U.S. PATENT DOCUMENTS

2016/0249453 A1 *   8/2016   Tatami ................. C01B 32/205
2017/0355603 A1    12/2017   Tachibana et al.

FOREIGN PATENT DOCUMENTS

JP    2009132602 A    6/2009
JP    2010001191 A    1/2010
(Continued)

OTHER PUBLICATIONS

Machine Translation of JP 2010-064949 (Year: 2010).*
(Continued)

*Primary Examiner* — Zachary M Davis
(74) *Attorney, Agent, or Firm* — Osha Bergman Watanabe & Burton LLP

(57) ABSTRACT

A thermal interlace material for transferring heat by interposing between two materials may include a graphite film. The graphite film may have a thickness T of 200 nm to 3 µm, and a ratio Ra/T of an arithmetic average roughness Ra on a surface of the graphite film to the thickness T of the graphite film, may be 0.1 to 30.

20 Claims, 6 Drawing Sheets

(51) Int. Cl.
  *C09J 7/29*    (2018.01)
  *C09J 201/00*  (2006.01)
  *H05K 7/20*    (2006.01)

(56) References Cited

FOREIGN PATENT DOCUMENTS

| JP | 2010064949 A | * | 3/2010 | ............ C01B 32/20 |
| JP | 2014133669 A |   | 7/2014 | |
| JP | 2017071528 A |   | 4/2017 | |
| WO | WO-2015045641 A1 | * | 4/2015 | ............ B32B 27/20 |
| WO | 2016129442 A1 |   | 8/2016 | |

OTHER PUBLICATIONS

Extended European Search Report issued in corresponding European Patent Application No. 18748781.4, dated Oct. 16, 2020 (7 pages).

International Search Report issued in International Application No. PCT/JP2018/002957, dated Apr. 17, 2018 (1 page).

Written Opinion issued in International Application No. PCT/JP2018/002957, dated Apr. 17, 2018 (9 pages).

\* cited by examiner

[Fig. 1]
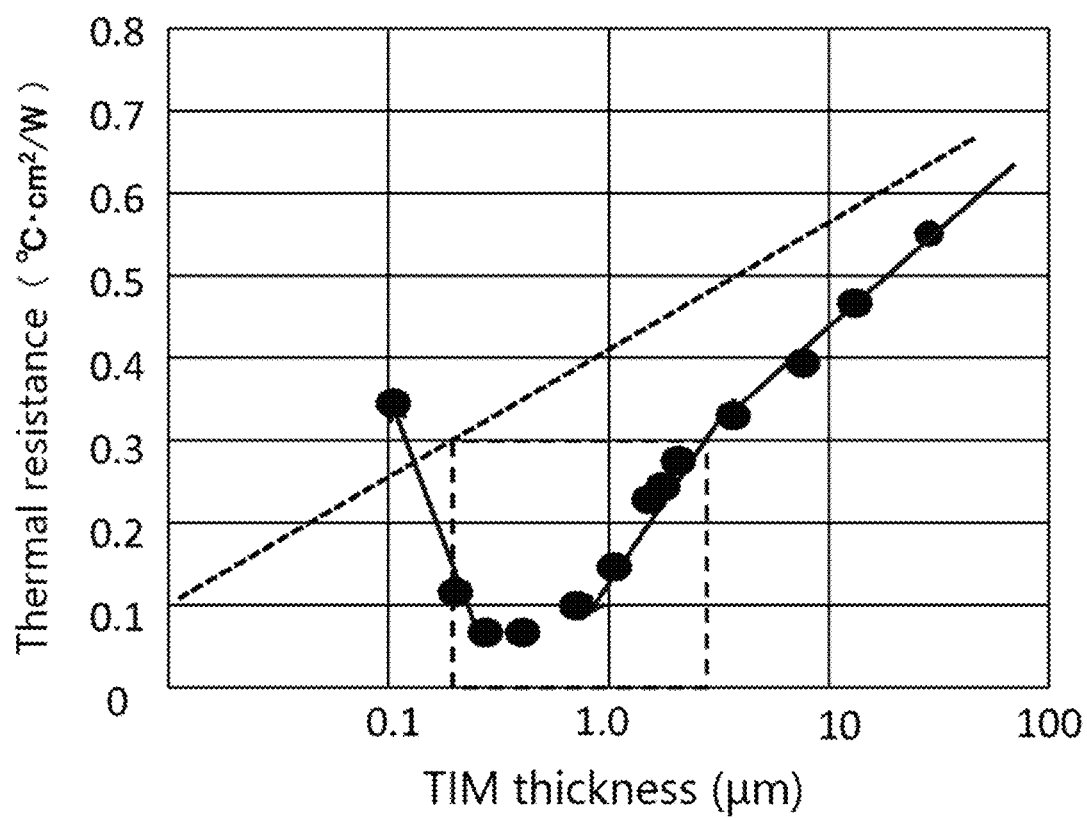

[Fig. 2]
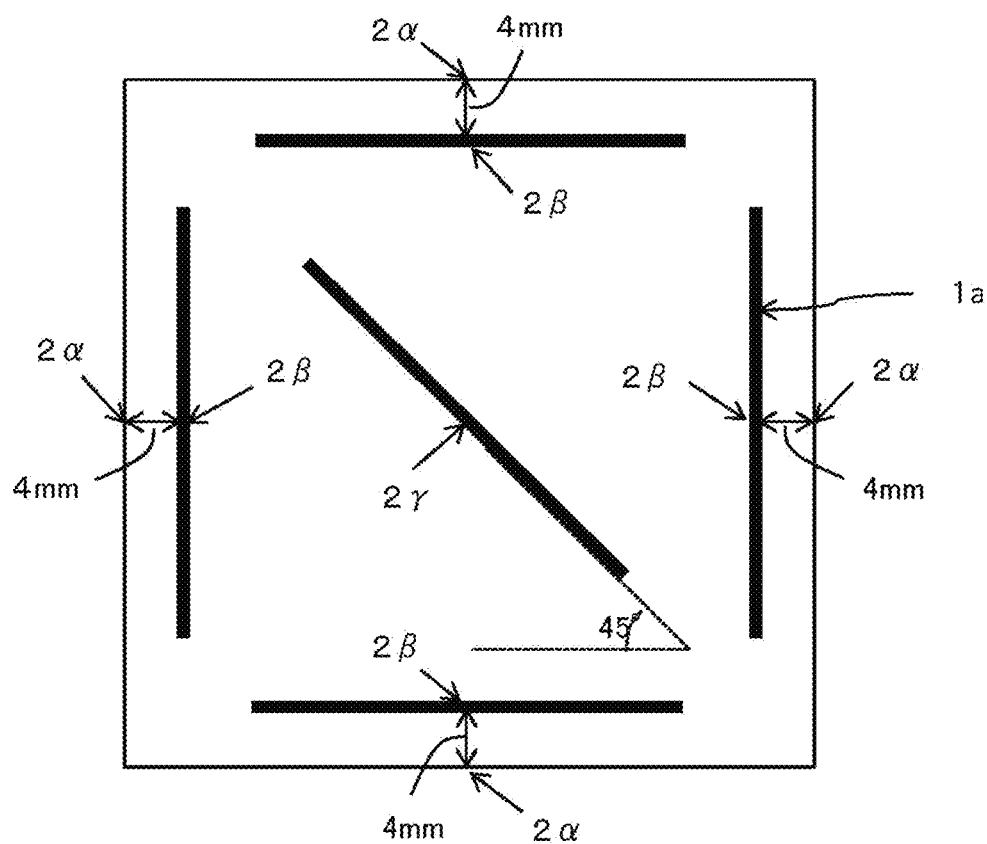

[Fig. 3]
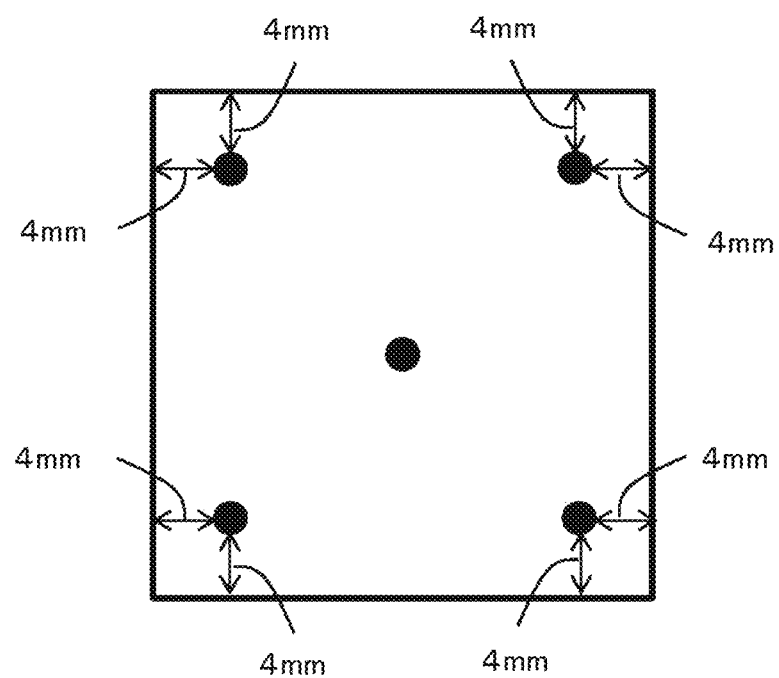
[Fig. 4]
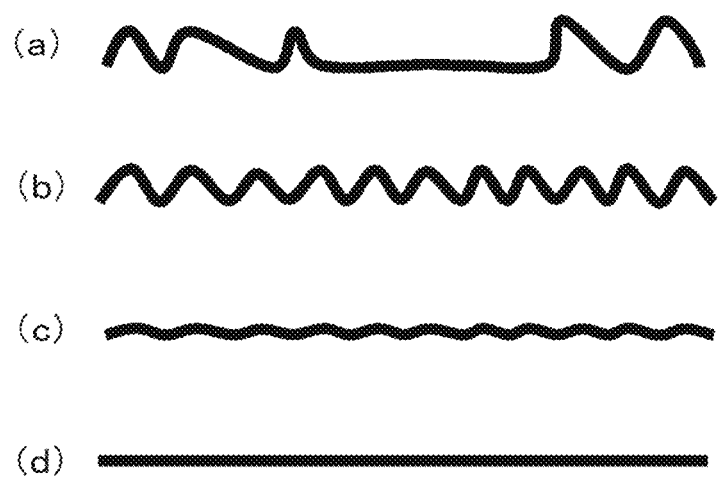

[Fig. 5]
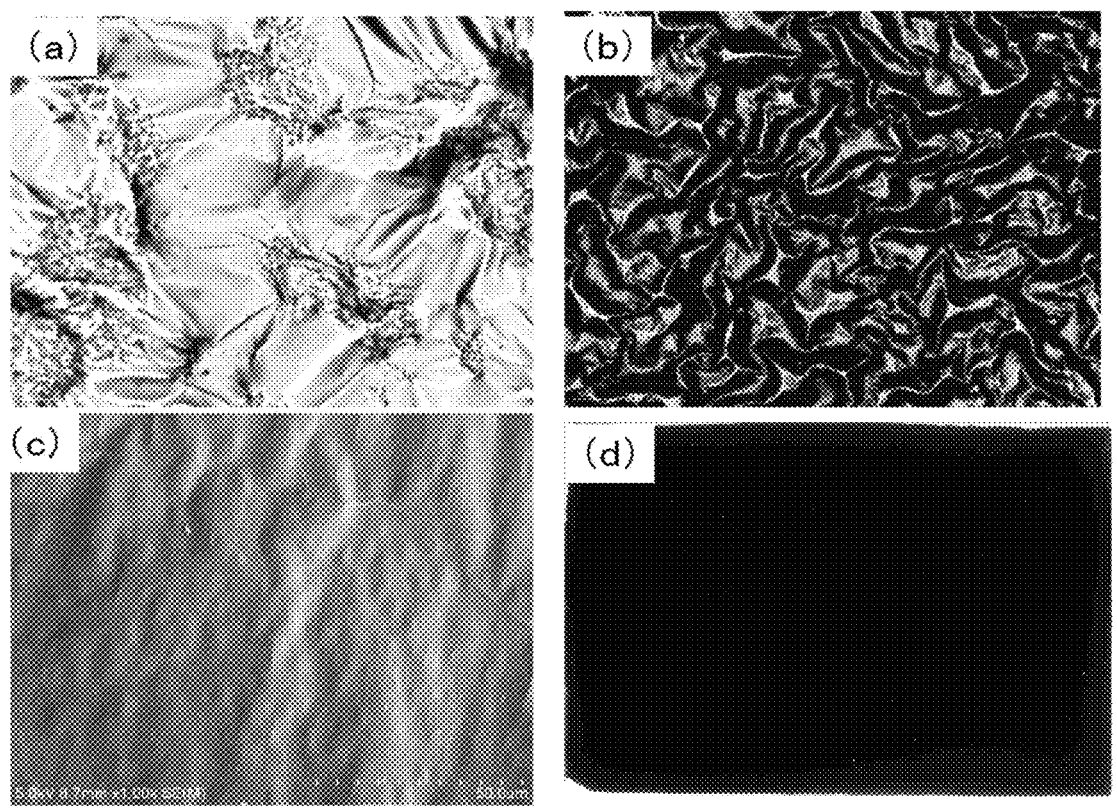

[Fig. 6]
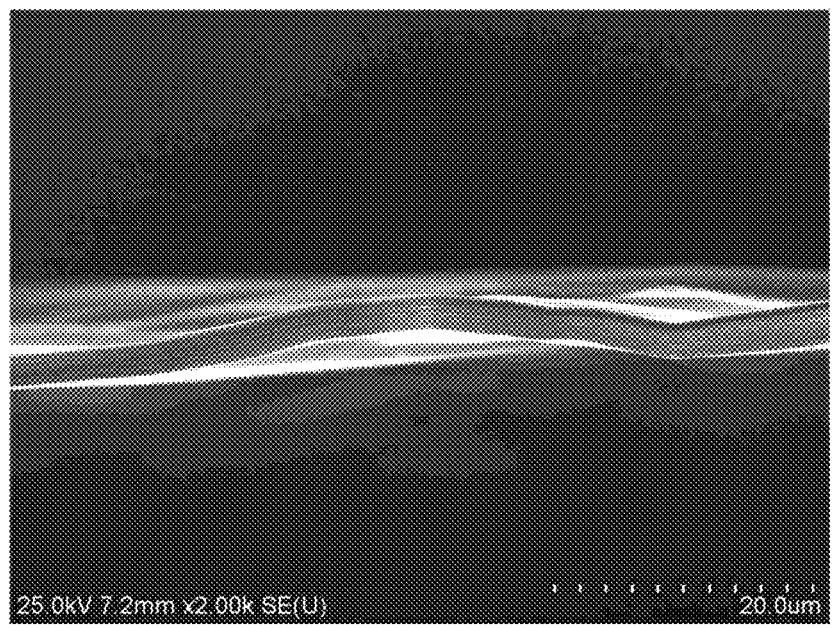

[Fig. 7]
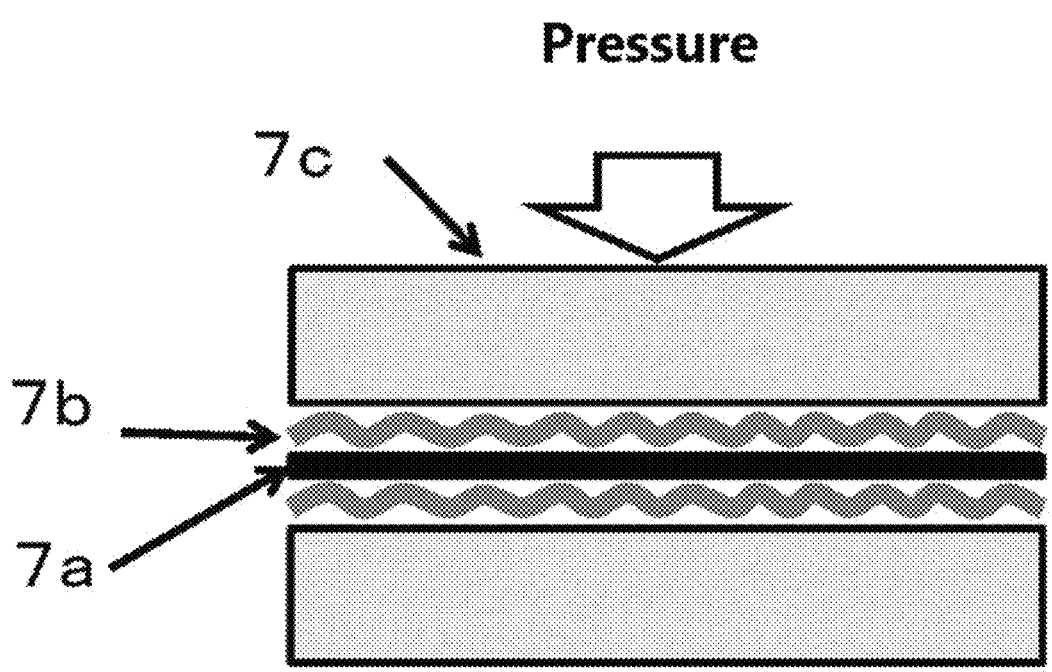

THERMAL INTERFACE MATERIAL, METHOD FOR THERMALLY COUPLING WITH THERMAL INTERFACE MATERIAL, AND METHOD FOR PREPARING THERMAL INTERFACE MATERIAL

TECHNICAL FIELD

The present invention relates to a thermal interface material for rapidly transferring heat from a heat generation source to a cooling material or a heat radiating material, a method for thermally coupling with the thermal interface material, and a method for preparing the thermal interface material.

BACKGROUND ART

In recent years, the heat generation amount has increased according to the higher speed of microprocessors or higher performance of LED (Light Emitting Diode) chips, and heat in electronic devices such as a portable phone, a personal computer, a PDA (Personal Digital Assistant), and a game apparatus as well as in LED illumination is great problems to be solved. For heat dissipation and cooling, there are many methods such as thermal conductions, thermal radiations, or heat convections. In order to effectively dissipate or cool the heat from a heat generation source, there is a need to combine these heat-dissipating and cooling methods so that the heat from a heat generating material may be efficiently transferred to a heat-dissipating and cooling material such as a circuit substrate, a cooling fin, a heat sink, or the like. For that purpose, it is important to reduce the thermal resistance between the heat generating material and the heat-dissipating and cooling material.

When the hard materials such as a metal and a ceramic are simply coupled with each other, the coupling between the hard materials only forms point contacts due to the unevennesses on the surfaces of both the hard materials. As a result, a thermal resistance becomes large due to the existence of an air layer having a low thermal conductivity (thermal conductivity: 0.02 W/mK) between the hard materials. In order to lower such thermal resistance between the hard materials, a thermal interface material (Thermal Interface Material, hereafter abbreviated as TIM) is interposed between materials such as between metals or between a metal and a ceramic. Conventionally, for that purpose, a mixture of a polymer material having flexibility for achieving surface contact and a highly thermally conductive inorganic filler for providing the TIM itself with a high thermal conductivity has been used (polymer-inorganic composite, hereafter abbreviated as composite TIM). However, such a mixture cannot exhibit sufficient performance.

Patent Document 1 filed by the present inventors discloses that the thin graphite film exhibits excellent performance as the TIM. Concretely, the developed TIM contains the graphite film having a thickness of 10 nm to 15 μm, a thermal conductivity of 500 W/mK or more in a film plane direction, anisotropy of thermal conductivities of 100 or more in both the surface direction and the thickness direction of the graphite film. In addition, Patent document 1 discloses that the TIM made of the graphite film exhibits thermal resistance properties of from 0.98° C.·cm$^2$/W (thickness of 13 μm) to 0.33° C.·cm$^2$/W (thickness of 105 nm) under a pressure, for example, of 1.0 kgf/cm$^2$. In the specification, the unit of the pressure is represented as MPa. For example, 1.0 MPa corresponds to 10.197 kgf/cm$^2$, and the pressure of 1.0 kgf/cm$^2$ may be equal to 0.1 MPa.

PRIOR ART

Patent Document

Patent Document 1: JP-A-2014-133669

SUMMARY OF THE INVENTION

Problem to be Solved by the Invention

Thus, an object of the present invention is to provide a thermal interface material (TIM) made of the graphite film having decreased thermal resistances compared with an already existing composite TIM and TIM containing the graphite film of Patent Document 1, in addition to decreased pressure dependency of the thermal resistance, and having excellent heat resistance and durability, a method for thermally coupling with the thermal interface material, and a method for preparing the thermal interface material.

Means for Solving the Problems

In order to further improve inventions of the prior-application (Patent Document 1), the present inventors have studied the influences on the thickness, the thermal conductivity, the anisotropy, and the wrinkle of the graphite film, and the like in detail. As a result, the present inventors have successfully developed a TIM made of the graphite film having a decreased thermal resistance compared with properties of Patent Document 1, by satisfying given conditions such as thicknesses, thermal properties, wrinkles, to complete the present invention.

This is based on a new fact, which was not conventionally known at all in the art, that the thermal resistance thereof as a bulk can be made extremely small due to the thin graphite film of the present invention, and further, the interfacial resistance thereof can be made extremely small by providing an optimal wrinkle on the graphite film. For example, the TIM of the present invention has the thermal resistance of 0.3° C.·cm$^2$/W or less as measured under an applied pressure of 0.1 MPa, and the most excellent thermal resistance of 0.078° C.·cm$^2$/W. The low thermal resistance achieved though the film of a solid is not known in the art at all up till now.

Such an extremely specific phenomenon can be definitely shown by plotting the relationship between the thickness and the thermal resistance of the TIM made of the graphite film of the present invention. FIG. 1 shows a relation between the thickness and the thermal resistance of the graphite film when a pressure of 0.1 MPa is applied. In the TIM made of the graphite film, the thermal resistance decreases according as the thickness of the graphite film decreases. This shows that the interfacial thermal resistance becomes smaller according as the thickness of the graphite film decreases. However, when the TIM made of the graphite film of the present invention has a thickness of 3 μm or less, the thermal resistance thereof rapidly becomes smaller, and an extremely excellent thermal resistance property of 0.3° C.·cm$^2$/W or less is achieved in the case where the graphite film has a thickness of 200 nm to 3 μm.

In a typical polymer composite TIM, the thickness and the thermal resistance are in a proportional relationship, and the point obtained by extrapolation to the thickness zero indicates the interfacial resistance (For example, see the chain line in FIG. 1). However, in the TIM made of the graphite film of the present invention, the thermal resistance does not intersect with the Y-axis even when extrapolated to the thickness zero, unlike the typical TIM in the region of 3 μm or less. Such an extremely specific phenomenon results in an excellent low thermal resistance property of the TIM made of the graphite film of the present invention. Therefore, the interfacial resistance decreases by decrease in the thickness of the graphite film and, for this reason, the thermal resistance as a TIM becomes specifically smaller in the case where the thickness is 200 nm to 3 μm (FIG. 1).

On the other hand, when the thickness of the graphite film is less than 200 nm, the thermal resistance becomes large. This is due to the insufficient contact between the graphite film and the measurement jig surface in the thickness of less than 200 nm.

Also, the thermal coupling using the TIM of the present invention can achieve specific thermal coupling such that the pressure dependency of the thermal resistance thereof is extremely small. Specifically, the difference in thermal resistances between 0.1 MPa pressure application and 0.45 MPa pressure application is within 1.8 times multiple, and the smallest pressure dependency that has been achieved by the present invention is as small as 1.1 times multiple. The fact that a solid TIM exhibits the extremely small thermal resistance under such a low pressure and no pressure dependency of the thermal resistance thereof, is also a specific phenomenon that was not conventionally known in the art. The facts that the pressure dependency of the thermal resistance is extremely small and that a low thermal resistance property is exhibited with a small pressure application mean that mechanical strong fastening is not needed. This further attains a practically extremely useful property that the thermal resistance thereof is affected little even when mechanical fastening is loosened. Here, in the present specification, "application of a pressure" is also referred to as "application of a load".

The thermal interface material of the present invention contains a thermal interface material for transferring heat by interposing between two materials, the thermal interface material contains a graphite film, the graphite film has a thickness T of 200 nm to 3 μm, and a ratio Ra/T of an arithmetic average roughness Ra on a surface of the graphite film to the thickness T of the graphite film is 0.1 to 30.

The Ra is obtained as follows. When a part of a reference length L is cut along with an average line direction from a roughness curve expressed by Y=f(X) regarding the average line of the cut part as the X axis and regarding a longitudinal direction as the Y axis, the arithmetic average roughness Ra is the value obtained by the following formula (1) and expressed in μm.

[Mathematical Formula 1]

$$R_a = \frac{1}{l} \int_0^l |f(x)| dx \quad (1)$$

When the ratio Ra/T is 0.1 to 30, for example, the graphite film having a thinnest thickness of 200 nm has Ra of 0.02 μm to 6 μm, and the graphite film having a largest thickness of 3 μm has Ra of 0.3 μm to 90 μm. Particularly, it is important that the graphite film having a thickness of 200 nm is limited to have Ra of 6 μm or less and the graphite film having a thickness of 3 μm is limited to have Ra of 0.3 μm or more.

In other words, the graphite film of the present invention desirably has Ra of 0.3 μm to 6 μm on the surface of the graphite film.

The present inventors further have found that not only the size of the wrinkle but also the uniformity of the wrinkle is preferably controlled to achieve the low thermal resistance property. Principally, the uniformity of the wrinkle of the graphite film is evaluated by a ratio (Ra/Rave) in which the Ra is each of arithmetic average roughnesses measured at the plural sites and the Rave is an average of the arithmetic average roughnesses determined from the measurement results of the total plural sites. However, it is impossible to measure the Ra of all the sites in a predetermined area, and it is extremely difficult to describe the wrinkle quantitatively. For this reason, the uniformity of wrinkles can be quantitatively evaluated by a method shown in FIG. 2. First, a graphite film as a sample is cut to a size of 50×50 mm², and the surface roughness Ra is measured in the line-segment directions at five sites shown by black lines in FIG. 2. In FIG. 2, 2α is a midpoint of each side of the about 50 mm square graphite film; 2β is a midpoint of the black line segment at each of the five sites; and 2γ is a centroid of the about 50 mm square graphite film. Among the line segments at the five sites, one line segment forms an angle of 45° relative to each side of the graphite film, and the midpoint of the line segment coincides with the centroid of the graphite film. Further, the other four line segments are respectively parallel to the four sides of the graphite film, and the distance to the nearest side is 4 mm. The line segment that connects the midpoint 2β of each line segment to the midpoint 2α of the nearest side is perpendicular to the nearest side. As a result, when measurement is made by such a method, the ratio (Ra/Rave) is preferably within a range of 0.2 to 5.0 in order to achieve the excellent thermal resistance property of the present invention. The aforementioned (Ra/Rave) of 0.2 to 5.0 means that the values of $Ra_i$/Rave are all within a range of 0.2 to 5.0, assuming that the arithmetic average roughnesses measured at the aforementioned five sites are respectively $Ra_i$ (i is one of 1 to 5) and that the average value of $Ra_1$ to $Ra_5$ is Rave. When the area of the graphite film is smaller than 50×50 mm², the graphite film may be cut to have a square shape, and the measurement points may be set at the four line segments that are respectively parallel to the four sides of the square and spaced apart by a predetermined distance therefrom and at the line segment located on the diagonal line of the square, in the same manner as in the aforementioned case of 50×50 mm².

Specifically, the ratio (Ra/Rave) as an index for evaluating the uniformity of wrinkles defined in the preferable embodiment of the present invention is inherently measured by the method described in FIG. 2, so that this case may be included in the preferable range of the present invention even if the ratio (Ra/Rave) measured by a method other than this is out of the range of 0.2 to 5.0.

In addition, the graphite film of the present invention preferably has a density of 1.60 g/cm³ to 2.26 g/cm³ and a thermal conductivity of 1000 W/mK or more in a film plane direction. The larger the thermal conductivity in a film plane direction, the more the heat is transferred. The maximum thermal conductivity of the graphite film is 2000 W/mK in a-b plane direction. Therefore, the graphite film of the present invention preferably has the thermal conductivity of 1000 W/mK or more and 2000 W/mK or less. Generally, the thermal conductivity of the film plane direction has great influences on TIM properties. However, when the graphite film has the thermal conductivity of 1000 W/mK in the film plane direction, the thermal conductivity of the thickness direction becomes about 5 to 10 W/mK, so that there is little changes in the thermal conductivity of the thickness direction. Further, the thermal conductivity of the thickness direction hardly has influences on the TIM property because the TIM made of the graphite film of the present invention has an extremely thinner thickness. Therefore, in the preferred embodiment, it is sufficient that the TIM of the present invention only recites the thermal conductivity of the film plane direction. In the specification, the film plane direction is a direction parallel to a surface of the film and the thickness direction is a direction vertical to the film plane.

The present invention contains a method for thermally coupling with the solid thermal interface material to be interposed between two materials in which at least one (preferably both) of the following (a) and (b) satisfied:
(a) a thermal resistance of 0.3° C.·cm$^2$/W or less on a load of 0.1 MPa
(b) a ratio $R_{0.1P}/R_{0.45P}$ of thermal resistance $R_{0.1P}$ on a load of 0.1 MPa to thermal resistance $R_{0.45P}$ on a load of 0.45 MPa of 1.8 or less (preferably less than 1.8).

The above thermal coupling method is extremely effective in the case where at least one of materials is used in a severe environment at 125° C. or more such that the composite TIM cannot be used.

A method for preparing a TIM made of the graphite film of the present invention is not limited particularly, and it is preferable that the polymer film is carbonized and graphitized to prepare the graphite film. The carbonization and the graphitization of the polymer film results in the horizontally oriented graphite film.

A method for providing an optimal wrinkle with the graphite film is not limited particularly, and it is preferable that in at least one of the carbonizing step and the graphitizing step, the polymer film, the carbonized film, or the graphite film is supported at multiple points, the polymer film, the carbonized film, or the graphite film is carbonized and/or graphitized while pressing.

Further, it is preferable that in at least one of the carbonizing step and the graphitizing step, a spacer (preferably a spacer having a surface roughness Ra of 0.2 μm to 20 μm) is laminated on at least one plane of the polymer film, the carbonized film, or the graphite film, and a laminate of the spacer and the polymer film, the carbonized film, or the graphite film is carbonized and/or graphitized while pressing.

The spacer is not limited particularly as long as the spacer has a desirable unevenness, durability, and heat resistance, and it is preferable that the spacer contains a felt composed of a carbon such as a carbon fiber or a graphite fiber.

The kinds of the polymer materials are not limited particularly, and the polymer film preferably contains a condensed aromatic polymer. The graphite film having a desirable property can be prepared by using the above polymer film as a raw material. Further, it is preferable that the polymer film containing the condensed aromatic polymer is carbonized and graphitized at a temperature of 2400° C. or more to prepare the graphite film, the polymer film containing the condensed aromatic polymer has a thickness of 400 nm to 7.5 μm (preferably 300 nm to 7.5 μm), and the condensed aromatic polymer contains an aromatic polyimide.

Specifically, the present invention to solve the above problem is as follows:
(1) A thermal interface material for transferring heat by interposing between two materials, wherein the thermal interface material contains a graphite film, the graphite film has a thickness T of 200 nm to 3 μm, and a ratio of an arithmetic average roughness Ra on a surface of the graphite film to the thickness T of the graphite film is 0.1 to 30.
(2) The thermal interface material according to (1), wherein each of the arithmetic average roughnesses Ra is 0.3 μm to 6.0 μm on a surface of the graphite film, and a ratio of each of the arithmetic average roughnesses Ra on two or more parts of the graphite film to an average Rave of the arithmetic average roughnesses Ra is 0.2 to 5.0.
(3) The thermal interface material according to (1) or (2), wherein the graphite film has a density of 1.60 g/cm$^3$ to 2.26 g/cm$^3$, and a thermal conductivity of 1000 W/mK to 2000 W/mK in a film plane direction.
(4) A method for thermally coupling materials with the thermal interface material according to any one of (1) to (3), wherein a thermal resistance of the thermal interface material is 0.3° C.·cm$^2$/W or less on a load of 0.1 MPa.
(5) A method for thermally coupling materials with the thermal interface material according to any one of (1) to (3), wherein a ratio $R_{0.1P}/R_{0.45P}$ of a thermal resistance $R_{0.1P}$ on a load of 0.1 MPa to a thermal resistance $R_{0.45P}$ on a load of 0.45 MPa of the thermal interface material is 1.0 to 1.8.
(6) A method for preparing the thermal interface material according to any one of (1) to (3), containing carbonizing a polymer film to form a carbonized film, and graphitizing the carbonized film to form a graphite film.
(7) The method according to (6), wherein in at least of the carbonizing step (the carbonization step) and the graphitizing step (the graphitization step), the polymer film, the carbonized film, or the graphite film is supported at multiple points, and the polymer film, the carbonized film, or the graphite film, is carbonized and/or graphitized while pressing.
(8) The method according to (7), wherein in at least one of the carbonizing step (the carbonization step) and the graphitizing step (the graphitization step), a spacer is laminated on each plane of the polymer film, the carbonized film, or the graphite film, and a laminate of the spacer and the polymer film, the carbonized film, or the graphite film is carbonized and/or graphitized while pressing.
(9) The method according to (8), wherein the spacer has a surface roughness Ra of 0.2 μm to 20 μm.
(10) The method according to (8) or (9), wherein the spacer contains a felt composed of a carbon fiber or a graphite fiber.
(11) The method for according to any one of (6) to (10), wherein the polymer film contains a condensed aromatic polymer.
(12) The method according to any one of (6) to (11), containing carbonizing and graphitizing the polymer film at a temperature of 2400° C. or more, wherein the polymer film contains an aromatic polyimide and has a thickness of 300 nm to 7.5 μm.

Effect of the Invention

According to the present invention, the solid thermal interface material in which the excellent thermal coupling property (the decreased thermal coupling property) is exhibited compared with the conventional composite TIM and the TIM of patent Document 1, the pressure dependency of the thermal resistant is greatly reduced, and the interfacial thermal coupling is excellent in environment stability such as heat resistance is provided.

BRIEF DESCRIPTION OF THE DRAWINGS

FIG. 1 is a graph showing the relations between the thickness and the thermal resistance of the graphite film on a load of 0.1 MPa.

FIG. 2 shows a method of measuring the surface roughness (Ra) and sites to be measured in the present invention. For the measurement, a graphite film having a 50 mm square shape is used, and the measurement sites of the surface roughness Ra are the five sites shown by the line segments in FIG. 2. In FIG. 2, 2α is a midpoint of each side of the graphite film; 2β is a midpoint of the line segment at each of five sites; and 2γ is a centroid of the graphite film having a 50 mm square shape. The surface roughness (arithmetic average roughness Ra) is measured in the line-segment direction at the five sites.

FIG. 3 shows sites for measuring the thickness of the graphite film of the present invention. The thicknesses are measured at five points (indicated by black circles) as shown in FIG. 3, and an average of the thicknesses is calculated to consider this as a thickness of the graphite film. In FIG. 3, a center point is a centroid of the graphite film having a 50 mm square shape. Each of four points near to corners is a point that is 4 mm apart from each of nearest two sides in the perpendicular direction and the inside direction.

FIG. 4 is a cross-sectional view illustrating a state of wrinkle in a graphite film of the present invention, where FIG. 4(a) is an image of a cross-section of a graphite film having a portion in which almost no wrinkle is partially present and having a partially non-uniform and large unevenness; FIG. 4(b) is an image of a schematic cross-section of the graphite film having an uniform and large unevenness which is out of the range of the present invention; FIG. 4(c) is an image of a schematic cross-section of a graphite film having an optimal unevenness of the present invention; and FIG. 4(d) is an image of a schematic cross-section of a graphite film with little unevenness, which is out of the range of the present invention.

FIG. 5 is an example of a surface photograph of a graphite film, where FIG. 5(a) is an example of a graphite film having a non-uniform and large wrinkle; FIG. 5(b) is an example of a graphite film having a uniform and large wrinkle; FIG. 5(c) is an example of a graphite film having a uniform and preferable size wrinkle; and FIG. 5(d) is an example of a graphite film with little wrinkle. FIGS. 5(a), 5(b), 5(c), and 5(d) are examples of the graphite film corresponding to the cross-sectional images shown in FIG. 4, and correspond to FIGS. 4(a), 4(b), 4(c), and 4(d), respectively.

FIG. 6 is a cross-sectional SEM photograph of a TIM made of a graphite film (FIG. 5(c)) of the present invention, where a suitable and uniform wrinkle is formed on the graphite film.

FIG. 7 is a schematic view of one example of a method for preparing a TIM made of a graphite film of the present invention where the graphite film is sandwiched with flat plane substrates and the graphite film is pressed.

MODE FOR CARRYING OUT THE INVENTION

Hereafter, embodiments of the present invention will be described in detail. Here, all of the academic documents and patent documents described in the present specification are incorporated in the present specification as a reference. Also, in the present specification, unless specifically mentioned otherwise, the term "A to B" representing a numerical range means "A or more (inclusive of A and more than A) and B or less (inclusive of B and less than B)".

The present invention contains a solid TIM (thermal interface material) to be interposed between two materials, the thermal interface material contains a graphite film, the graphite film has a thickness T of 200 nm to 3 μm, and a ratio of an arithmetic average roughness Ra on a surface of the graphite film to the thickness T of the graphite film is 0.1 to 30. The TIM of the present invention satisfies at least one (preferably both) of the following (a) and (b): (a) a thermal resistance of 0.3° C.·cm$^2$/W or less on a load of 0.1 MPa and (b) a ratio $R_{0.1P}/R_{0.45P}$ of thermal resistance $R_{0.1P}$ on a load of 0.1 MPa to thermal resistance $R_{0.45P}$ on a load of 0.45 MPa of 1.8 or less (preferably less than 1.8). The ratio $R_{0.1P}/R_{0.45P}$ is 1.0 or more because $R_{0.1P}$ is larger than $R_{0.45P}$. As shown in Examples, the present invention can achieve a lowest thermal resistance of 0.078° C.·cm$^2$/W (a thickness of 400 nm and a load of 0.1 MPa).

The thermal resistance property (property of transferring heat) of a TIM (thermal interface material) obtained by the present invention is compared with the thermal resistance property of a TIM made of the graphite film obtained by the prior application (Patent Document 1). Patent Document 1 discloses that a thermal resistance is 0.98 to 0.33° C.·cm$^2$/W on a pressure with 1.0 kgf/cm$^2$ when a graphite film has a thickness of 13 μm to 18 nm, and the thermal resistance is 0.43 to 0.34° C.·cm$^2$/W when the thickness of the graphite film is 3 μm to 200 nm. From these, the realized thermal resistance property (0.3° C.·cm$^2$/W or less, lowest value: 0.078° C.·cm$^2$/W) of the present invention is further improved compared with properties of Patent Document 1, and this results from the formation of the optimal wrinkles in the present invention.

With regard to the pressure dependency of the thermal resistance property, in the range of 200 nm to 3 μm in Patent Document 1, the ratio $R_{1.0P}/R_{4.5P}$ of the thermal resistance when a pressure of 1.0 kgf/cm$^2$ is applied to the thermal resistance when a pressure of 4.5 kgf/cm$^2$ is applied is 2.23 times to 1.95 times multiple. Also, Patent Document 1 teaches that when the graphite film has a thickness of 105 nm, a thermal resistance is 0.33° C.·cm$^2$/W on a load of a pressure of 1.0 kgf/cm$^2$ and that the ratio of the thermal resistance on a load of 1.0 kgf/cm$^2$ to the thermal resistance on a load of 4.5 kgf/cm$^2$ is 1.83 times multiple, respectively. In other words, in the graphite film having a thickness of 200 nm or more, a pressure dependency of 1.8 times multiple or less (particularly, less than 1.8 times multiple) has not been achieved. On the contrary, the present invention has improved such a property of Patent Document 1 to a great extent and has achieved an excellently low thermal resistance and small pressure dependency of thermal resistance in a practical thickness range of 200 nm to 3 μm. Hereafter, the present invention will be described in detail.

(A) Graphite Film Containing Conditions to be Satisfied

The graphite film of the present invention has a thickness of 200 nm or more, preferably 300 nm or more, more preferably 400 nm or more, and 3 μm or less, preferably 2.5 μm or less, and more preferably 2 μm or less. In the case of more than 3 μm, there is a problem that the thermal resistance increases. In the case of less than of 200 nm, there are problems that the thermal resistance increases and the handling of the graphite film as the self-supporting film becomes difficult. On the other hand, when the graphite film has a thickness of 200 nm to 3 μm, the excellent thermal resistant property can be accomplished than that of the TIM made of the graphite film of Patent document 1. The decreased thermal resistant property is much excellent compared to that of conventional composite TIM, and the TIM made of the graphite film of the present invention has excellent heat resistance and durability because the graphite film does not contain the polymer.

The graphite film of the present invention preferably has a density of preferably 1.60 g/cm$^3$ to 2.26 g/cm$^3$, more preferably 1.70 g/cm$^3$ to 2.26 g/cm$^3$, and most preferably 1.80 g/cm$^3$ to 2.26 g/cm$^3$. The density of 2.26 g/cm$^3$ is an ideal density in the graphite film containing no air layer. The inclusion of the air layer in the graphite film can be confirmed by measuring a density of the graphite film. It is desirable that there is little air layer within the graphite film because the air layer has an extremely decreased thermal conductivity. Like this, the density can be considered as a measure of the presence of the air layer.

Also, the graphite film of the present invention has the thermal conductivity in the film plane direction of preferably 1000 W/mK or more, more preferably 1200 W/mK or more, even preferably 1300 W/mK or more, and most preferably 1400 W/mK or more. The maximum thermal conductivity of the film plane direction of the graphite film is 2000 W/mK as a monocrystal graphite. The reason why it is important that the thermal conductivity in the film plane direction is large in the present invention can be described as follows. That is, since the thermal coupling between the TIM made of the graphite film and the materials forms point contacts and the graphite film has the extremely large thermal conductivity in the film plane direction of the graphite film, the heat that has flowed in from one coupling point is rapidly diffused within the TIM made of the graphite film. As a result, the heat can flow from numerous coupling points to the materials on the lower-temperature side. In other words, the high thermal conductivity in the film plane direction of the graphite film produces the same effects as in the case where the graphite film is in contact at a larger number of coupling points than the actual number of coupling points. Such an effect is larger according as the thermal conductivity in the film plane direction is larger, so that the thermal conductivity in the film plane direction is important for the decreased thermal resistance. Thus, the present invention has found that the thermal conductivity in the film plane direction is important in improving the TIM properties.

The graphite film of the present invention has a feature that a ratio of an arithmetic average roughness Ra of the surface of the graphite film to thickness T, or (Ra/T) is 0.1 to 30. The ratio Ra/T is preferably 0.2 or more, more preferably 0.3 or more, and preferably 20 or less, more preferably 10 or less. Particularly, the ratio Ra/T is more preferably 0.2 to 20, and most preferably 0.3 to 10. The arithmetic average roughness Pa is important to realize excellently decreased thermal resistance and the small pressure dependency of the thermal resistance. As mentioned above, the optimal wrinkles can be expressed by the arithmetic average roughness of 0.3 μm to 6 μm on the surface of the graphite film. The arithmetic average roughness of the surface of the graphite film specified in the present invention may be an average of the arithmetic average roughnesses measured at multiple sites on the graphite film and may be an average of the arithmetic average roughnesses measured at five sites as shown in FIG. 2.

In the case where the uniformity of the wrinkles of the graphite film of the present invention is measured with the above method, a ratio (Ra/Rave) of each Ra values measured to an average Rave of multiple Ra values is preferably 0.2 or more, more preferably 0.4 or more, even preferably 0.5 or more, and preferably 5.0 or less, more preferably 3.0 or less, and even preferably 2.0 or less. Particularly, the ratio of Ra/Rave is preferably 0.2 to 5.0, more preferably 0.4 to 3.0, and most preferably 0.5 to 2.0.

As shown above, the thermal interface material of the present invention has the graphite film having a thickness of 200 nm to 3 μm in which the graphite film can be practically handled and prepared. Therefore, a bulk thermal resistance is small due to thinner thickness, the graphite film has the flexibility, multi-point coupling close to surface contact can be realized by optimal surface roughness, so that excellent thermal resistance can be realized in the TIM.

(B) Method for Preparing Polymer Film

A method for preparing the graphite film is not limited particularly and the graphite film can be prepared by baking of the polymer film. The polymer film preferably contains a condensed aromatic polymer, and the polymer is preferably at least one selected from polyimide, polyimide, polyquinoxaline, polyoxadiazole, polybenzimidazole, polybenzoxazole, polybenzthiazole, polyquinazolinedione, polybenzoxazinone, polyquinazolone, benzimidazobenzophenanthroline ladder polymer, and derivatives thereof.

The polymer film is preferably an aromatic polyimide film in the view of the conversion of the polymer film to the high quality graphite. In addition, the aromatic polyimide film is preferably a film having controlled molecular structures and higher structures and excellent orientation in the view of the simple conversion to the high quality graphite.

The aromatic polyimide film can be produced by various publicly known techniques. For example, the polyimide film of the present invention is produced by casting the above-mentioned organic solvent solution containing a polyamic acid as a polyimide precursor on a support such as an endless belt or a stainless steel drum, drying and imidizing the solution. In addition, the polyimide film can be prepared by heating a thin film containing a polyamic acid formed by the vapor deposition polymerization, and imidizing the film. The vapor deposition polymerization is effective for the preparation of the polyimide film having an extremely thinner thickness of 3 μm or less.

Examples of a method for producing a polyimide include, without limiting particularly, a thermal cure method in which a polyamic acid of a precursor is imidized by heating, and a chemically curing method in which both or one of a dehydrating agent typified by acid anhydrides such as acetic anhydride and tertiary amines such as picoline, quinoline, isoquinoline and pyridine, is used as an imidization accelerator for polyamic acid to perform imidization.

Specifically, a method for preparing a polyimide film using the chemically curing method is as follows. The dehydrating agent containing a larger amount than an amount of stoichiometry and the imidization accelerator containing the same amount as a catalyst are added to a solution containing a polyamic acid and an organic solvent to prepare a mixture, the mixture is casted or coated on a substrate, an organic film such as PET, or a supporting body such as drum or endless belt to prepare a film-like layer, drying the organic solvent by heating to prepare a film having mechanical strength. Then, the film is further heated, dried, imidized to prepare a polyimide film composed of the polyimide polymer. The temperature of heating is preferably the range of from 150° C. to 550° C. The increasing rate of the temperature for heating the polymer is not limited particularly, and it is preferable that the polymer is continuously, intermittently or gradually heated to control the maximum temperature within the above range. Further, in the course of the preparation of the polyimide, it is preferable that the film is fixed or expanded to prevent the shrinkage. The fixation or the expansion of the film can increase the orientation of the polymer. The polyimide film has, for example, an average linear thermal expansion coefficient of $0.5 \times 10^{-6}$ to $5.0 \times 10^{-5}$ cm/cm/° C. in the case of the measurement at 100° C. to 200° C. and a birefringence of 0.1 to 0.2.

The thickness of the graphite film finally obtained is changed according to a thickness of a polymer film as a raw material. In the aromatic polyimide, a thickness of the graphite film finally obtained is commonly often about 60% to 40% of a thickness of a starting polymer film having a thickness of 1 µm or more, or about 50% to 30% of a thickness of a starting polymer film, having a thickness of less than 1 µm. Accordingly, in order to obtain a graphite film of the present invention having a thickness of 200 nm to 3 µm, a starting polymer film preferably has a thickness of from 300 nm to 7.5 µm.

(C) Method for Preparing Graphite Film

A method for preparing a TIM made of the graphite film of the present invention is not limited particularly as long as the graphite film having desirable properties is obtained. The graphite film is preferably prepared by carbonization and graphitization of a polymer film. The carbonization and the graphitization may be carried out at one furnace or separate furnaces. The carbonization and the graphitization of the polymer film is explained as follows. The carbonization is not limited particularly, and the polymer film of a starting material is preliminarily heated to carbonize the polymer film in an inert gas or in a vacuum. The inert gas preferably includes nitrogen gas, argon gas, a mixed gas of argon and nitrogen. The preliminary heating is carried out at a temperature of about 1000° C. The increasing rate of the temperature to the preliminary heating temperature is not limited particularly, and for example 5 to 15° C./minute and preferably 8 to 12° C./minute. The holding time of the preliminary heating temperature is for example 30 minutes to 2 hours. It is desirable that the tension of the plane direction is applied at a degree of no break of the film such that the orientation of the starting polymer film is not decreased at the stage of the preliminary heating.

The graphitization of the polymer is not limited particularly, and the film carbonized with the above method is set in a furnace at a high temperature to graphitize the film. The graphitization is carried out in an inert gas, and the inert gas is appropriately argon and both argon and helium in a small amount may be used. The temperature for the graphitization is preferably 2400° C. or more, more preferably 2600° C. or more, and most preferably 2800° C. or more from the view of the conversion to high quality graphite film at a higher temperature. The graphitization may be carried out at a given time, and the holding time for the graphitization is for example 5 minutes or more, preferably 10 minutes or more, and the holding time for the graphitization may be 20 minutes or less. The upper limit of the temperature for the graphitization is not limited particularly, and the temperature for the graphitization may be 3600° C. or less, or 3500° C. or less. The increasing rate of the temperature of from the preliminary heating to the graphitization is not limited particularly, and for example 10 to 30° C./minute, and preferably 15 to 25° C./minute. After the graphitization, the temperature may be decreased at for example 30 to 50° C./minute.

(D) Shape and Evaluation of Optimal Wrinkles

The graphite film prepared with the general methods have both regions with little wrinkles and regions with many uneven wrinkles (roughnesses) over the whole film plane. FIG. 4 (*a*) is an image of a schematic cross-section of a conventional graphite film having sites with little partial wrinkles or sites with uneven wrinkles of partially large unevennesses. Generally, the uneven wrinkles are produced in many cases where the carbonization and the graphitization are carried out without devised means as set forth below. Further, in the conventional preparation methods, it is hard to control not only the uniformity of the wrinkles but also the size of unevennesses of the wrinkles. Therefore, the conventional graphite film having no controlled wrinkles has great influences on the properties of the TIM, and it is preferable that the method for preparing the graphite film is newly devised in order to prepare the graphite film having controlled wrinkles.

The present inventors has found that in order to realize excellent TIM property containing the preferred embodiment, it is important to control a height of wrinkle (roughness) to thickness, and the uniformity of wrinkles. FIG. 4(*b*) is an image of a schematic cross-section of the graphite film having a uniform and large unevenness which is out of the range of the present invention and this expresses a schematic case where a ratio of average Ra/average thickness T (µm/µm) is more than 30. FIG. 4(*c*) is an image of a schematic cross-section of a graphite film having an optimal unevenness of the present invention and this expresses a schematic case where a ratio of average Ra/average thickness (µm/µm) is 0.1 to 30. FIG. 4(*d*) is an image of a schematic cross-section of a graphite film with little unevenness, which is out of the range of the present invention and this expresses a schematic case where a ratio of average Ra/average thickness (µm/µm) is less than 0.1.

FIG. 5 shows an example of an actual surface photograph of the schematic cross-sectional image corresponding to a graphite film shown in FIG. 4. FIGS. 5(*a*), 5(*b*), 5(*c*), and 5(*d*) correspond to FIGS. 4(*a*), 4(*b*), 4(*c*), and 4(*d*), respectively. Also, FIG. 6 is a cross-sectional SEM photograph of a graphite film in the state of FIG. 5(*c*), where a wrinkle having a suitable height has been uniformly formed. As described previously, FIG. 5(*a*) is an example in which a wrinkle is often generated in the case where the carbonization and the graphitization are carried out without applying a pressure. Further, FIG. 5(*b*) is an example in which a large wrinkle is often generated in the case where the carbonization is carried out by interposing with mirror-surface jigs, and the graphitization is carried out without applying a pressure. FIG. 5(*c*) is an example in which a graphite film has an optimal wrinkle that has been formed by the below-described technique of the present invention. Further, FIG. 5(*d*) is an example in which a graphite film has little wrinkle, which can be possibly obtained when the carbonization and the graphitization are carried out by interposing with jigs having mirror-surface.

As studied results, the TIM excellent in properties cannot be prepared when wrinkles as shown in FIGS. 5 (*a*) and (*b*) are formed and when the graphite film has no wrinkles as shown in FIG. 5 (*d*). On the other hand, the TIM excellent in properties can be prepared when the graphite film has a controlled wrinkle having a suitable size as shown in FIG. 5 (*c*). However, a method for controlling a size of the wrinkle of the graphite film as shown in FIG. 5 (*c*) has not been known, and there has been a need to develop a method for controlling a wrinkle of the graphite film to provide an optimal wrinkle, and a method for evaluating the wrinkle of the graphite film.

Specifically, roughness (wrinkle) of a suitable size to thickness can be evaluated with a ratio of the arithmetic average roughness Ra of the surface of the graphite film at each measured sites to the thickness T of the graphite film. In other words, the ratio Ra/T can be 0.1 to 30 in the preferred range of the present invention. When this is expressed by the preferred surface roughness of the graphite film of the present invention, Ra is 0.3 µm or more and 6 µm (6.0 µm) or less on the basis of the above mentions.

Such an arithmetic average roughness Ra can be determined by an already existing method, that is, an optical method such as a probe-type surface roughness meter or a laser microscope, or a method such as STM (Scanning Tunneling Microscope) or ATM (Atomic Force Microscope). For example, JIS B0601-2001 can be applied in the measurement of the arithmetic average roughness Ra.

In the graphite film of the present invention, not only Ra values as the size of the wrinkle but also the uniformity of the wrinkle is preferably controlled to realize the excellent thermal resistance property. Principally, the uniformity of the wrinkle of the graphite film is evaluated by a ratio of (Ra/Rave) in which the Ra is an arithmetic average roughness measured at each of the plural sites and the Rave is an average of the arithmetic average roughnesses determined at the total plural sites. Generally, it is slightly unclear to measure the Ra of multiple sites, and it is extremely difficult to describe the wrinkle quantitatively. For this reason, the uniformity of wrinkles of the TIM made of the graphite film of the present invention can be quantitatively evaluated by a method shown in FIG. 2 as a measure of the evaluation of the uniformity. This is effective for evaluation of the uniformity of the wrinkles in the present invention even if this is not necessarily absolute evaluation.

When Ra and Rave are measured by the method of FIG. 2, the graphite film of the present invention has the ratio of Ra/Rave of preferably 0.2 to 5.0, more preferably 0.3 to 3.0, and most preferably 0.4 to 2.0, Variations of Ra are reduced in the graphite film and the uniformity of the unevenness or the wrinkles is further improved, so that the TIM property can be achieved stably. In the present invention, the ratio of Ra/Rave of 0.2 to 5.0 is limited to the case of evaluating with the method of FIG. 2 in which the uniformity of the wrinkles is not absolutely evaluated.

(E) Method for Controlling Optimal Wrinkles

In the present invention, a method for appropriately controlling a Ra size and a uniformity of the wrinkle of the graphite film is not limited particularly. In conventional methods of preparing the graphite film from the polymer film, it is hard to form an optimal wrinkle. When the aromatic polyimide of the polymer film is carbonized, the carbonized film is shrunk to reduce the original area of the original polymer film by about 75 to 85 at the carbonization in many cases. In addition, when the shrinkage and the expansion of the film during the carbonization and the graphitization is left to nature, the area of the finally obtained graphite film is enlarged compared with the carbonized film, and the dimension of the graphite film is about 85 to 95 of the dimension of original polymer film. Thus, due to natural shrinkage and expansion, a region where large wrinkles are biased and a region where there is little wrinkle coexist in the graphite film, so that appropriate wrinkles cannot be formed.

The present inventors have found out that a preferable wrinkle can be formed when, in at least one of the carbonizing step (the carbonization step) and the graphitizing step (the graphitization step), a spacer having an unevenness of a suitable size is laminated onto one surface (preferably both surfaces) of at least one of the sample such as a polymer film, a carbonized film, or a graphite film, interposing these between flat and smooth pressing plates or jigs, and treating at a carbonization temperature and a graphitization temperature while pressurizing with a suitable pressure from both sides, thereby completing the present invention.

In the present invention, a suitable wrinkle is formed by controlling the shrinkage and expansion through a pressing treatment using a spacer. Specifically, a suitable wrinkle can be formed when a spacer having an unevenness with a suitable size is laminated onto one plane (preferably both planes) of one of a polymer film, a carbonized film, and a graphite film, interposing these between flat and smooth pressing plates or jigs, and treating at a carbonization temperature and a graphitization temperature while pressing with a suitable pressure from both sides. Here, the carbonization is carried out on a polymer film, and the graphitization is carried out on a carbonized film. Also, a re-graphitization may be carried out in accordance with the needs. The re-graphitization is carried out on a graphite film. In the case where the graphitization is carried out after a polymer film is carbonized, the aforementioned pressing treatment may be carried out in one or both of the carbonization step and the graphitization step.

FIG. 7 is a schematic cross-sectional view of a pressing method by interposing the film to be treated with flat plane substrates. The reference numerals 7a, 7b, and 7c denote a graphite film, a spacer, and a pressing jig, respectively. In this example, a spacer having a suitable unevenness is placed between two sheets of flat plane substrates, that is, between the pressing jig and the graphite film, and the spacer and the graphite film are pressurized with the flat plane substrates. The materials of the pressing plates and the spacer used in pressing the film to be treated are not particularly limited as long as the materials have durability against a high-temperature treatment; however, typically, the pressing plates or the spacer is preferably a carbon material or a graphite material. For example, a substrate made of CIP (Cold Isotropic Press: cold hydrostatic press) material that is isotropic graphite or glassy carbon can be used.

The spacer used in the present invention has unevenness of a suitable size, and the spacer has a surface roughness (Ra) of preferably 20 µm or less, more preferably 10 µm or less, and even preferably 5 µm or less. In addition, the spacer may have a surface roughness (Pa) of 0.2 µm or more.

It is difficult to uniquely determine the pressing conditions because the pressing conditions depend on complex combination of the factors such as the spacer shape, the type of the film to be treated (polymer film, carbonized film, or graphite film) and the thickness. However, the pressing conditions may be set in consideration of the following conditions. In other words, a polymer film shrinks in the carbonization step and expands in the graphitization step, so that the film is finely split in the shrinking step when the pressuring force is too strong. Also, a non-uniform wrinkle is generated in the graphitization step. On the other hand, when the pressuring force is too small, the unevenness of the spacer cannot be reflected as the unevenness of the graphite film. Accordingly, in the carbonization and the graphitization, the magnitude of the pressuring force is preferably changed in consideration of the elongation and shrinkage thereof instead of applying a uniform pressure.

The pressing of the carbonization and the graphitization may be continuous or intermittent and the pressing pressure can be appropriately set from, the range of 1 gf/cm$^2$ to 2000 gf/cm$^2$. The pressing pressure is preferably 2 gf/cm$^2$ or more, 5 gf/cm$^2$ or more, or 10 gf/cm$^2$ or more, and preferably 1000 gf/cm$^2$ or less, or 500 gf/cm$^2$ or less.

The pressing time may be appropriately set from a short period to a long period according to various conditions or the pressing may be carried out multiple times. However, it is desirable that the pressing of the graphitization is not completed at early stages, and continues up to the maximum temperature. The reason is as follows. At the graphitization treatment, the dimension of the graphite film in the film plane direction is elongated until the film temperature becomes the highest temperature. Therefore, in many cases, uneven wrinkles of the graphite film are generated by an uneven elongation of the film at a final stage of the graphitization when the pressing is ended at a very early stage for the graphitization. In addition, the pressing of the graphitization desirably starts after the graphite film starts to expand. When the pressing is performed at the very early stage before the graphite film starts to expand and then continued as it is, the graphite film unfavorably comes not to be elongated although the film is originally elongated into the film plane direction. This also causes the generation of finally-obtained surface irregularities of the graphite film. Thus, about the pressing timing, the pressing starts at a temperature of preferably 2200° C. or more, more preferably 2400° C. or more, and even preferably 2600° C. or more, and the pressing preferably continues up to the maximum temperature. The graphite film may be repeatedly pressed for a short period and may be further pressed also at the vicinity of the highest temperature. It is advisable to optimize appropriately the pressing pressure, period and timing, and other minute conditions, considering such a basis as described above.

The pressing means may be a pressing means (pressing mechanism) capable of controlling mechanical pressure or a non-mechanical means such as the pressing from the self-weight of the pressing plate or the pressing of a heavy stone made of graphite or carbon placed on the pressing plate. The non-mechanical means is suitable in applying a constant weak weight at all times during the carbonization and graphitization and can advantageously form a wrinkle having a suitable height in the graphite film.

The spacer is not particularly limited as long as the spacer has durability against both of the treatment temperature and the pressing force. The spacer may be a powdery particle or a film, or woven cloth fabricated from a fibrous substance. In particular, a carbon-based or graphite-based particle (particularly a powdery particle) or a carbon-based or graphite-based fibrous substance (particularly a film or woven cloth prepared from the fibrous substance) is preferably used. Examples of the powdery particle include a glassy carbon particle, a graphite particle, and a graphite scale. Examples of the fibrous substance include a carbon fiber and a graphite fiber. Also, it is possible to use an inorganic particle or the like, such as scale-like silica, alumina, spherical alumina, or scale-like boron nitride, particles to be carbonized and graphitized by heating such as polyimide particles at appropriate times. The materials of the spacer of the present invention include substances, such as silica, that cannot withstand up to a high temperature of 2800° C. or the like which is the final stage of graphitization.

The powdery particle is more preferably a particle having a lubricating effect. The carbon-based or graphite-based spacer has advantages such as ready availability, hardly raising problems because of being the same type of carbon-based substance even when adhering to the graphite film or in the electric furnace, and certain lubricity.

The roughness (unevenness) of the spacer surface molded in a film shape or woven cloth shape gives a large influence on the unevenness formation of the TIM made of the graphite film to be fabricated. However, the roughness of the spacer surface and the magnitude of the surface roughness of the graphite film do not necessarily coincide with each other. This is because the unevenness of the spacer surface plays a role of supporting the graphite film at points in some cases. This is a large role of the spacer to prevent breakage by shrinkage or expansion in the thermal treatment step of the graphite film.

An average particle size ($d_{50}$) of powdery particles as the spacer materials, a fiber diameter of fibrous substances as the spacer materials, and a thickness of scale as the spacer materials (hereinafter, the average particle size of the particles, the diameter of the fibers, and the thickness of the scales refer to as a thickness of the spacer in some cases) is, for example, 0.2 µm or more, preferably 0.5 µm or more, more preferably 1 µm, or more, and for example, 100 µm or less, preferably 50 µm or less, and more preferably 20 µm or less. The spacer may be a sheet (preferably those as sandpapers) having uniformly distributed projections and containing the particles, the fibers, or the like and may be a non-woven fabricated with many fibrous substances. Concretely, the preferable spacer to be used is a graphite sheet having exposed graphite particles on the surface thereof by carbonizing and graphitizing a polyimide film containing the graphite particles, a graphite sheet having formed graphite particles on the surface thereof by vapor-depositing a graphite particle on the graphite sheet, or a non-woven fabric composed of carbon fibers.

Further, it is also preferable to use the spacer in combination with a paste, an oil, a wax, or the like in view of adjusting the lubricity and further finely controlling the degree of unevenness of the wrinkle of the graphite film to be formed. Also, the substance used for the paste, the oil, the wax, or the like may be suitably selected. For example, in the case of the oil, a mineral oil, a synthesized hydrocarbon oil, an ester oil, a polyglycol oil, a silicone oil, a fluorine oil, a canola oil, or a mixture of these can be suitably used. Alternatively, the oil may be a modified oil. For example, in the case of the silicone oil, an epoxy-modified silicone oil, a polyether-modified silicone oil, an amino-modified silicone oil, or an epoxy-modified silicone oil can be used.

Any of the above examples corresponds to spacers obtained by processing particle spacers or fibrous spacers as raw materials to the film form or the fabric form. In spacers, the unevenness may be formed by methods such as a method of sprinkling spacers on the film to be treated or the pressing plate, a method of coating spacers with brush on the film to be treated or the pressing plate, a method of coating a dispersion containing dispersed spacers on the film to be treated or the pressing plate, and drying the dispersion, and a method of coating spacers with sieve on the film to be treated or the pressing plate.

Further, unevenness may be provided on the surface of the pressing jig or the pressing plate, and this may be used as the spacer having unevenness. In this case, it is preferable to let the pressing plate surface have a certain shape or surface roughness by treating the pressing jig surface with a sand paper, a sand blast, or a polishing material. For such a purpose, it is possible to use a pressing plate made of a CIP material or glassy carbon whose surface has been uniformly roughened to a certain degree, as the pressing jig. Further, it is also preferable to use a pressing plate made of a CIP material or glassy carbon in which a carbon fiber is allowed to firmly adhere to the surface of the plate by pressing the carbon fiber at a high temperature.

In the case of carbonizing or graphitizing the polymer film by supporting the raw material polymer film or the carbonized film at plural points, the obtained graphite film may be broken when the pressure is too large or due to adhesion caused by static electricity. In such a case, it is preferable to perform static elimination with a suitable antistatic agent or an ionizer.

Various kinds of techniques described above for providing an optimal roughness on the TIM made of the graphite film may be suitably selected in accordance with the production process without limiting to the contents of the Examples given below. Further, the method of preparing the TIM made of the graphite film of the present invention is excellent in productivity because numerous sheets can be stacked and fired at the same time. Also, the preparation method is applicable even in the case where the film to be treated has an extremely small thickness as in the range of the present invention and is liable to be physically broken.

According to the method for preparing the TIM made of the graphite film of the present invention, optimal wrinkles can be formed, ratios of arithmetic average roughness (Ra) thickness can be controlled in an appropriate range, and a variation of properties of the TIM made of the graphite film can be reduced in the preferred embodiment. Therefore, the thermal resistance at interface can be decreased by the formation of such a wrinkle and the thermal resistance of the TIM can be decreased.

(F) Method for Thermally Coupling with TIM

The method for thermally coupling materials using the TIM of the present invention contains a step of placing the aforementioned TIM between the materials to be thermally coupled. In other words, the method for thermally coupling materials with the TIM of the present invention contains bringing the thermal interface material according to the present invention into contact with two materials, and placing (interposing) the thermal interface material between the two materials, so that the heat is transmitted from one material (first material) to the other material (second material). By interposing the TIM of the present invention between the materials (between the first material and the second material), the heat from the heat generation source or the material thermally coupled to the heat generation source (first material) transfers to the second material having a temperature equal to or lower than that (preferably a temperature lower than that of the first material), and the method for thermally coupling with TIM can be carried out. The graphite film is placed by being interposed between the material near the heat source and the material far from the heat source, and the graphite film is in direct surface contact with each material. In order to achieve excellently thermostable interface thermal coupling, it is preferable that the thermal coupling between materials is carried out simply with the graphite film alone without using various kinds of bonding layers. As a method for realizing the thermal coupling between materials without the intervention of the bonding layers, fixation may be made with a simple mechanical pressure. Mechanical swaging with a screw, a thread, a spring, or the like is effective for direct thermal coupling and hence is preferable. However, there is not necessarily a need for strong swaging in consideration of the fact that low thermal resistance can be achieved under a low pressure and the fact that the pressure dependency of the thermal resistance is small as a feature of the present invention. Even when the swaging pressure changes, the influence thereof is small, so that a practically extremely effective thermal coupling between materials can be realized. When a pressure is applied with a mechanical pressure or the like, the value of the pressure may be 0.1 MPa or more, preferably 0.2 MPa or more. An upper limit of the pressure is not particularly limited; however, the pressure is preferably 1 MPa or less, more preferably 0.8 MPa or less, because the effect is saturated when the pressure is too large, and also the TIM material may break by excessive pressure. By such thermal coupling, the thermal resistance when a load of 0.1 MPa is applied can be made to be 0.3° C.·cm$^2$/W or less. The thermal resistance when a load of 0.1 MPa is applied is preferably 0.27° C.·cm$^2$/W or less, more preferably 0.25° C.·cm$^2$/W or less, and even preferably 0.2° C.·cm$^2$/W or less. Also, the ratio ($R_{0.1P}/R_{0.45P}$) of the thermal resistance ($R_{0.1P}$) when a load of 0.1 MPa is applied to the thermal resistance ($R_{0.45P}$) when a load of 0.45 MPa is applied can be made to be 1.0 to 1.8, preferably less than 1.8, more preferably 1.5 or less, and even preferably 1.4 or less.

Accordingly, the method for thermally coupling with the thermal interface material of the present invention is particularly excellent in a high-temperature environment in addition to the decreased thermal resistance. In particular, the thermally coupling with the TIM made of the graphite film having the excellent heat resistance and the durability is an extremely effective when the temperature of at least one of the thermal coupling materials is 150° C. or higher, and the effectiveness thereof can be exhibited in a LED or a power semiconductor or in a severe environment such as a vicinity of an automobile engine.

The present application claims the benefit of priority to Japanese Patent Application Number 2017-017697 filed on Feb. 2, 2017. The entire contents of the specification of Japanese Patent Application Number 2017-017697 filed on Feb. 2, 2017 are hereby incorporated by reference.

EXAMPLES

Hereinafter, the present invention will be described in detail with reference to Examples, but the present invention is not limited thereto, and the variation and the modification of the present invention without departing the gist described above and below are all included the technical scope of the present invention.

<Measurement Method of Physical Property>

First, a method of measuring the physical properties in the following Examples is shown in the following.

(1) Thickness of Graphite Film

The thickness at arbitrary five sites as shown in FIG. 3 of a graphite film cut out to have a size of 50×50 mm$^2$ was measured with a contact-type thickness gauge, and an average value thereof was determined as the thickness of the graphite film.

(2) Density of Graphite Film

The density of the graphite film was measured by using a dry-type automatic density meter AccuPyc II 1340 (manufactured by Shimadzu Corporation). The density was measured sheet by sheet with respect to the five sheets of graphite film, and an average value thereof was determined as the density.

(3) Thermal Conductivity of Graphite Film

The thermal diffusion rate of graphite film was measured by using a thermal diffusion rate measurement apparatus employing the periodic heating method ("LaserPit" apparatus manufactured by ULVAC, Inc.) and using a frequency of 10 Hz at 25° C. in vacuum (about 10$^{-2}$ Pa). This was a method of attaching a thermocouple at a point spaced apart by a certain distance from the point of laser heating and measuring the temperature change thereof. However, by this method, when the thickness of the graphite film was 1 μm or less, it was impossible to perform correct measurement, because the measurement error was too large. Accordingly, as a second measurement method, measurement was carried out using the periodic heating radiation temperature-measuring method (Thermoanalyzer TA3 manufactured by BETHEL Co., Ltd.). This was an apparatus in which periodic heating was carried out with laser, and temperature measurement was carried out with a radiation thermometer, and the apparatus was completely in no contact with the graphite film during the measurement, so that even a sample in which the thickness of the graphite film was 1 μm or less can be measured. In this apparatus of BETHEL Co., Ltd., the frequency of periodic heating can be changed within a range up to 800 Hz at the maximum. In other words, the characteristic feature of this apparatus lies in that the temperature measurement is carried out with a radiation thermometer, and the measurement frequency can be variable. In principle, a constant thermal diffusion rate can be measured even when the frequency was changed, so that, in the measurement using the present apparatus, the measurement was carried out by changing the frequency. When a sample having a thickness of 1 μm or less was measured, the measurement value was often varied at the measurement of 10 Hz or 20 Hz; however, the measurement value was almost constant at the measurement of 70 Hz to 800 Hz. Accordingly, the thermal diffusion rate was determined by using a numerical value that indicated a constant value irrespective of the frequency (value at 70 Hz to 800 Hz). The thermal conductivity (W/mK) was calculated by multiplying the thermal diffusion rate (m²/s), the density (kg/m³), and the specific heat (798 kJ/(kg·K)).

(4) Arithmetic Average Roughness Ra on Surface of Graphite Film and Ra/T

Surface roughness (arithmetic average roughness) Ra of the graphite film at room temperature (20° C.) was measured by using a surface roughness measuring instrument (Surfcom DX manufactured by TOKYO SEIMITSU Co., LTD.) in accordance with JIS B 0601. A sample of a graphite film having a 50 mm×50 mm square size was used to measure the surface roughness. Portions of measuring the surface roughness Ra were five portions shown in line segments of FIG. 2. The reference length L was determined in accordance with JIS B 0633. When a part of the reference length L was cut from the chart drawn at a feed rate of 0.05 mm/sec and the roughness curve was expressed by Y=f(X) regarding the average line of the cut part as the X axis and regarding a longitudinal direction as the Y axis, the arithmetic average roughness Ba was the value obtained by the following formula (2) and expressed in μm. Each of Ra values was measured at five portions of the graphite film (center portions 2β of line segments 1a), and an average value of five Re values was calculated to obtain the arithmetic average roughness Re of the graphite film.

[Mathematical Formula 2]

$$R_a = \frac{1}{l}\int_0^L |f(x)|dx \qquad (2)$$

The selected graphite film at measurement of arithmetic average roughness (Ra) (five sites per one sheet of graphite film) was used to measure thicknesses at five sites as shown in FIG. 3, and an average thereof was calculated. Then, ratios of arithmetic average roughness Ra (μm)/thickness (μm) were calculated every graphite films to obtain an average value thereof. Thus, average Ra at five sites/average thickness at five sites was considered to be a ratio of Ra (μm)/thickness (μm).

(5) Calculation of Ra/Rave Ratio of Graphite Film

As mentioned above, when the arithmetic average roughness Ra was measured at five portions as shown in FIG. 2 on the selected graphite film, a ratio of each of the arithmetic average roughnesses Ra to an average value of the arithmetic average roughnesses Ra, that is, a ratio of Re/Rave was determined to consider this as the variation of the graphite film.

(6) Measurement of Thermal Resistance of Graphite Film

The thermal resistance of the TIM made of the graphite film of the present invention was measured by using a precision thermal resistance measurement apparatus manufactured by Hitachi Technologies and Services, Ltd. The present measurement apparatus was an apparatus capable of measuring a precise thermal resistance, and an error thereof was ±0.002° C.·cm²/W. The sample dimension was 10×10 mm²; the load was 0.1 MPa to 0.45 MPa (corresponding to 1.0 kgf/cm² to 4.5 kgf/cm²); and the measurement temperature was 60° C. Specifically, first the applied watt number (W) was adjusted so that the interfacial temperature was 60° C., and the measurement was made for 10 times after the temperature change became constant. An average value thereof was determined as the measured value of the thermal resistance.

(7) Preparation of Samples used in Examples and Comparative Examples

Hereafter, a standard method of preparing fourteen graphite films used in the Examples and the Comparative Examples is described.

A curing agent made of 20 g of acetic anhydride and 10 g of isoquinoline was mixed with 100 g of a 18 wt % DMF solution of a polyamide acid prepared from pyromellitic acid dianhydride, 4,4'-diaminodiphenyl ether, and p-phenylenediamine (4/3/1 in a molar ratio) and stirred. After defoaming by centrifugal separation, the mixture was cast and applied onto an aluminum foil. The processes from the stirring till the defoaming were carried out while cooling to 0° C. This laminate of the aluminum foil and the polyamide acid solution was heated at 120° C. for 150 seconds, so as to obtain a gel film having a self-supporting property. This gel film was peeled of from the aluminum foil and fixed to a frame. This gel film was heated at 300° C., 400° C., and 500° C. each for 30 seconds, so as to produce fourteen polyimide films having an average linear expansion coefficient of 1.6×10⁻⁵ cm/cm/° C. at 100 to 200° C. and a birefringence of 0.14, and having different thicknesses.

The obtained polyimide film was heated up to 1000° C. at a heating rate of 10° C./minute in a nitrogen gas with use of an electric furnace and held at 1000° C. for one hour to perform a preliminary treatment. Next, the obtained carbonized film was interposed between spacers made of a graphite fiber felt with surface roughness Ra of 5 μm, and further, these were placed between graphite blocks subjected to surface polishing and set in a graphite heater furnace. The temperature was raised up to 290° C. at a heating rate of 20° C./minute, and the maximum temperature was held for 10 minutes. Thereafter, the temperature was lowered at a cooling rate of 40° C./minute. The graphitization treatment was carried out in an argon atmosphere. During this, a load of 100 gf/cm² was applied to the sample.

Each of thickness, thermal conductivity, density of fourteen graphite films (A) to (N) is shown below.

(A) thickness: 2.8 μm, thermal conductivity of film plane direction: 1800 W/mK, density: 2.0 g/cm³
(B) thickness: 2.3 μm, thermal conductivity of film plane direction: 1750 W/mK, density: 2.0 g/cm³
(C) thickness: 1.7 μm, thermal conductivity of film plane direction: 1740 W/mK, density: 2.0 q/cm³
(D) thickness: 1.2 μm, thermal conductivity of film plane direction: 1660 W/mK, density: 2.0 g/cm³

(E) thickness: 1.0 μm, thermal conductivity of film plane direction: 1680 W/mK, density: 2.0 g/cm³
(F) thickness: 0.7 μm, thermal conductivity of film plane direction: 1710 W/mK, density: 2.1 g/cm³
(G) thickness: 0.4 μm, thermal conductivity of film plane direction: 1780 W/mK, density: 2.0 g/cm³
(H) thickness: 0.3 μm, thermal conductivity of film plane direction: 1600 W/mK, density: 1.9 g/cm³
(I) thickness: 0.2 μm, thermal conductivity of film plane direction: 1580 W/mK density: 1.9 g/cm³
(J) thickness: 30 μm, thermal conductivity of film plane direction: 1610 W/mK, density: 2.0 g/cm³
(K) thickness: 18 μm, thermal conductivity of film plane direction: 1840 W/mK, density: 2.0 g/cm³
(L) thickness: 8 μm, thermal conductivity of film plane direction: 1880 W/mK, density: 2.1 g/cm³
(M) thickness: 4.8 μm, thermal conductivity of film plane direction: 1760 W/mK, density: 2.1 g/cm³
(N) thickness: 0.1 μm, thermal conductivity of film plane direction: 1580 W/mK, density: 2.0 to 1.8 g/cm³

Examples 1 to 9

As Examples, the thermal resistances of the above samples (A) to (I) were measured. The results are shown in Table 1. In Table 1, the ratio of the arithmetic average roughness Ra to the thickness of each sample (Ra (μm)/thickness (μm)) is also shown. The thicknesses of the samples (A) to (I) were 0.2 μm to 2.8 μm, and the thermal conductivity in the film plane direction and the density were all within a range of the conditions that the TIM of the present invention should satisfy in a preferable mode. Also, the values of (Ra/T) were within a range of 0.16 to 5.0 and were within a range of the conditions that the TIM of the present invention should satisfy. The thermal resistances of these samples were 0.078 to 0.29° C.·cm²/W (in the case in which the load was 0.1 MPa), and an extremely low thermal resistance outstandingly surpassing the property of a conventional TIM was exhibited. Further, the ratios $R_{0.1P}/R_{0.45P}$ of the thermal resistance ($R_{0.1P}$) when a pressure of 0.1 MPa was applied to the thermal resistance ($R_{0.45P}$) when a pressure of 0.45 MPa was applied were extremely small and the largest one among these samples was 1.42 times multiple, and the smallest one was 1.12 times multiple. These results showed that the TIM of the present invention had an extremely excellent property.

TABLE 1

| Example | Sample | Thickness (μm) | (Ra/thicknessT) (μm/μm) | Thermal resistance (° C.·cm²/W) | | | Pressure dependency |
| --- | --- | --- | --- | --- | --- | --- | --- |
| | | | | 0.1 (MPa) | 0.2 (MPa) | 0.45 (MPa) | ($R_{0.1P}/R_{0.45P}$) |
| 1 | (A) | 2.8 | 0.16 | 0.29 | 0.28 | 0.22 | 1.32 |
| 2 | (B) | 2.3 | 0.32 | 0.26 | 0.24 | 0.20 | 1.30 |
| 3 | (C) | 1.7 | 0.29 | 0.25 | 0.23 | 0.19 | 1.32 |
| 4 | (D) | 1.2 | 0.72 | 0.24 | 0.22 | 0.17 | 1.42 |
| 5 | (E) | 1.0 | 1.86 | 0.162 | 0.153 | 0.120 | 1.35 |
| 6 | (F) | 0.7 | 1.77 | 0.107 | 0.086 | 0.080 | 1.34 |
| 7 | (G) | 0.4 | 2.2 | 0.078 | 0.071 | 0.067 | 1.18 |
| 8 | (H) | 0.3 | 3.6 | 0.080 | 0.072 | 0.068 | 1.12 |
| 9 | (I) | 0.2 | 5.0 | 0.121 | 0.118 | 0.100 | 1.21 |

Comparative Examples 1 to 9

As Comparative Examples, the thermal resistances of each of the above samples (J) to (N) is shown in Table 2. The thicknesses of these samples were out of the range of the present invention in the thick direction with respect to the samples (J) to (M) and in the thin direction in the sample (N). The ratios of (Ra/T) were also out of the range of the present invention with respect to the samples (J) and (K), though the ratios were within the range of the present invention with respect to the samples (I), (M), and (N). The thermal resistances of these samples were all 0.3° C.·cm²/W or more (when the load was 0.1 MPa). Also, the ratios $R_{0.1P}/R_{0.45P}$ were large except for the sample (N). The value of $R_{0.1P}/R_{0.45P}$ of the sample (N) was 1.2 times multiple, and this showed that the pressure dependency of the thermal resistance was small as a feature of the TIM of the present invention. However, the sample (N) had a thermal resistance of 0.36° C.·cm²/W (when the load was 0.1 MPa) and was extremely thin (thickness of 0.1 μm), so that it was difficult to use the sample (N) as a practical TIM.

TABLE 2

| Comparative Example | Sample | Thickness (μm) | (Ra/thicknessT) (μm/μm) | Thermal resistance (° C.·cm²/W) | | | Pressure dependency |
| --- | --- | --- | --- | --- | --- | --- | --- |
| | | | | 0.1 (MPa) | 0.2 (MPa) | 0.45 (MPa) | ($R_{0.1P}/R_{0.45P}$) |
| 1 | (J) | 30 | 0.02 | 0.54 | 0.49 | 0.30 | 1.8 |
| 2 | (K) | 18 | 0.04 | 0.48 | 0.40 | 0.23 | 2.09 |
| 3 | (L) | 8 | 0.16 | 0.40 | 0.34 | 0.22 | 1.82 |
| 4 | (M) | 4.8 | 0.30 | 0.33 | 0.25 | 0.18 | 1.83 |
| 5 | (N) | 0.1 | 30 | 0.36 | 0.33 | 0.30 | 1.2 |

Examples 10 and 11 Comparative Examples 6 and 7

Four kinds of graphite films were fabricated in the same manner as the method of sample (G) except that the maximum treatment temperature for the graphitization was changed in 2700° C. (G-1), 2400° C. (G-2), 2100° C. (G-3), or 1700° C. (G-4). Each of thicknesses, thermal conductivities, densities of fourteen graphite films is shown below.

(G-1) thickness: 0.4 μm, thermal conductivity of film plane direction: 1580 W/mK, density: 2.0 g/cm$^3$
(G-2) thickness: 0.4 μm, thermal conductivity of film plane direction: 1100 W/mK, density: 2.0 g/cm$^3$
(G-3) thickness: 0.5 μm, thermal conductivity of film plane direction: 500 W/mK, density: 1.9 g/cm$^3$
(G-4) thickness: 0.6 μm, thermal conductivity of film plane direction: 390 W/mK, density: 1.9 g/cm$^3$ The thermal conductivity of each sample was measured. Table 3 shows the results. The thicknesses and the ratios (Ra/T) of the surface arithmetic average roughness Ra to the thickness of each sample were all within the range of the conditions that the TIM of the present invention should satisfy. However, the thermal conductivities of (G-3) and (G-4) in the film plane direction were out of the range of the conditions that the TIM of the present invention should satisfy. The thermal resistances of (G-3) and (G-4) were 0.58° C.·cm$^2$/W and 1.1° C.·cm$^2$/W, respectively (when the load was 1 kgf/cm$^2$), and were all 0.3° C.·cm$^2$/W or more. From these, in the TIM of the present invention, the thermal conductivity in the film plane direction is preferably 1000 W/mK or more and as a temperature for fabricating the graphite film, it is preferable to carbonize and graphitize the polymer film at a temperature of 2400° C. or higher.

TABLE 3

| | Sample | Thermal conductivity in film plane direction (W/mK) | Thermal resistance (° C. · cm$^2$/W) | | | Pressure dependency |
| --- | --- | --- | --- | --- | --- | --- |
| | | | 0.1 (MPa) | 0.2 (MPa) | 0.45 (MPa) | ($R_{0.1P}/R_{0.45P}$) |
| Example 4 | (G) | 1780 | 0.079 | 0.071 | 0.067 | 1.18 |
| Example 10 | (G-1) | 1580 | 0.12 | 0.10 | 0.095 | 1.26 |
| Example 11 | (G-2) | 1100 | 0.26 | 0.23 | 0.19 | 1.36 |
| Comparative Example 6 | (G-3) | 500 | 0.58 | 0.47 | 0.30 | 1.93 |
| Comparative Example 7 | (G-4) | 390 | 1.10 | 0.62 | 0.52 | 2.12 |

Examples 12 to 15 Comparative Examples 8 to 12

Each of carbonized films was interposed between spacers made of a graphite fiber felt having a different surface roughness Ra, and this was placed between graphite blocks subjected to surface polishing and set in a graphite heater furnace, so as to fabricate 9 kinds of graphite films ((A-1), (A-2), (A-3), (A-4), (I-1), (I-2), (I-3), (I-4), and (I-5)). Among these, (A-1) and (I-1) were fabricated by being directly interposed between graphite blocks subjected to surface polishing without using a graphite fiber felt, and were mirror-surface samples with little wrinkle. Also, the other 7 kinds of samples (A-2), (A-3), (A-4), (I-2), (I-3), (I-4), and (I-5)) were fabricated by the same method as the previously described method of fabricating the samples (A) and (I) except that the surface roughness of the felt put to use and the pressure applied to the samples were changed. Also, (I-4) was treated by interposing with a felt having a surface roughness of 20 μm or more and comparatively uniform but large wrinkles were present in this. (A-4) and were fabricated without applying a pressure at all (in a free state) and non-uniform wrinkles were present in these. Here, in the present Examples, for the purpose of specifying the optimal surface roughness range and shape for achieving an excellent thermal resistance property, the thickest sample (A) and the thinnest sample (I) within the range of the present invention have been selected.

Each of thickness T, thermal conductivity, density, (Ra/T), variation of (Ra/Rave) at five sites of obtained graphite films is shown below.
(A-1) thickness T: 2.8 μm, thermal conductivity of film plane direction: 1800 W/mK, density: 2.1 g/cm$^3$, (Ra/T): 0.04, (Ra/Rave): 0.8 to 1.2
(A-2) thickness T: 2.8 μm, thermal conductivity of film plane direction: 1720 W/mK, density: 2.1 g/cm$^3$, (Ra/T): 0.2, (Ra/Rave): 0.6 to 1.3
(A-3) thickness T: 2.8 μm, thermal conductivity of film plane direction: 1700 W/mK, density: 2.0 g/cm$^3$, (Ra/T): 0.5, (Ra/Rave): 0.7 to 1.6
(A-4) thickness T: 2.8 μm, thermal conductivity of film plane direction: 1800 W/mK, density: 2.1 g/cm$^3$, (Ra/T): 2.8, (Ra/Rave): 0.14 to 6.4
(I-1) thickness T: 0.2 μm, thermal conductivity of film plane direction: 1680 W/mK, density: 2.0 g/cm$^3$, (Ra/T): 0.05, (Ra/Rave): 0.7 to 1.4
(I-2) thickness T: 0.2 μm, thermal conductivity of film plane direction: 1830 W/mK, density: 2.1 g/cm$^3$, (Ra/T): 2.8, (Ra/Rave): 0.8 to 1.27
(I-3) thickness T: 0.2 μm, thermal conductivity of film plane direction: 1700 W/mK density: 2.0 g/cm$^3$, (Ra/T): 4.0, (Ra/Rave): 0.4 to 1.6
(I-4) thickness T: 0.2 μm, thermal conductivity of film plane direction: 1620 W/mK, density: 2.1 g/cm$^3$, (Ra/T): 32, (Ra/Rave): 0.3 to 2.5
(I-5) thickness T: 0.2 μm, thermal conductivity of film plane direction: 1620 W/mK, density: 2.1 g/cm$^3$, (Ra/T): 42, (Ra/Rave): 0.18 to 5.2

Among these samples, (A-2), (A-3), (I-2), and (I-3) were samples in which the state of the wrinkle thereof (Ra/T) and the variation (Ra/Rave) were both within a preferable range of the present invention. On the other hand, (A-1) was a sample in which (Ra/T) was 0.04 and which was close to a mirror surface, and (A-4) was a sample in which the variation of (Ra/T) was 0.14 to 6.4, both exceeding the preferable range of the present invention. Further, (I-1) was a sample in which the variation of (Ra/T) was 0.05 and which was close to a mirror surface; (I-4) was a sample in which the variation of (Ra/T) was 32; and (I-5) was a sample in which the variation of (Ra/T) was 42 and in which the variation of (Ra/Rave) was 0.18 to 5.2, all being out of the preferable range of the present invention. The results of measuring the thermal resistance properties of these samples are shown in Table 4.

TABLE 4

| Sample | (Ra/thickness T) | Variation of Ra/Rave | Thermal resistance (° C.·cm²/W) 0.1 (MPa) | 0.2 (MPa) | 0.45 (MPa) |
|---|---|---|---|---|---|
| Example 12 | A-2 | 0.2 | 0.6 to 1.3 | 0.24 | 0.22 | 0.19 |
| Example 13 | A-3 | 0.5 | 0.7 to 1.6 | 0.26 | 0.23 | 0.21 |
| Example 14 | I-2 | 2.8 | 0.8 to 1.27 | 0.09 | 0.09 | 0.08 |
| Example 15 | I-3 | 4.0 | 0.4 to 1.6 | 0.12 | 0.10 | 0.09 |
| Comparative Emmple 8 | A-1 | 0.04 | 0.8 to 1.2 | 1.30 | 0.86 | 0.72 |
| Comparative Emmple 9 | A-4 | 2.8 | 0.14 to 6.4 | 2.00 | 1.62 | 1.13 |
| Comparative Example 10 | I-1 | 0.05 | 0.7 to 1.4 | 0.87 | 0.76 | 0.64 |
| Comparative Example 11 | I-4 | 32 | 0.3 to 2.5 | 0.68 | 0.62 | 0.58 |
| Comparative Example 12 | I-5 | 42 | 0.18 to 5.2 | 1.02 | 0.94 | 0.87 |

From these results, in the thermal interface material made of the graphite film of the present invention, the size and the uniformity of the wrinkle thereof give a large influence on the thermal resistance properties. In order to achieve excellent thermal resistance properties, it was necessary that (Ra/T) showing the size of the wrinkle was within a range of 0.1 to 30 and that (Ra/Rave) showing the uniformity of the wrinkle was 0.2 to 5.0. In particular, the tact that (A-1) and (I-1) having little wrinkle cannot achieve an excellent thermal property, and the fact that it was not sufficient that the size of the wrinkle thereof was simply large but a suitable wrinkle needed to be present, were not known in the art at all up till now and have been made clear for the first time by the studies of the present invention.

EXPLANATION OF NUMERICAL REFERENCE 1a line segment
2α midpoint of each side
2β midpoint of line segment
2γ centroid
7a graphite film
7b spacer
7c pressing jig

The invention claimed is:

1. A thermal interface material for transferring heat by interposing between two materials, wherein:
the thermal interface material comprises a graphite film,
the graphite film has a thickness T of 200 nm to 3 μm and a density of 1.70 g/cm³ or more,
each of the arithmetic average roughness Ra is 0.3 μm to 6.0 μm on a surface of the graphite film,
a ratio Ra/T of an arithmetic average roughness Ra on a surface of the graphite film to the thickness T of the graphite film is 0.1 to 30, and
a thermal resistance of the thermal interface material is 0.3° C.·cm²/W or less on a load of 0.1 MPa.

2. The thermal interface material according to claim 1, wherein a ratio Ra/Rave of each of the arithmetic average roughnesses Ra on two or more parts of the graphite film to an average Rave of the arithmetic average roughnesses Ra is 0.2 to 5.0.

3. The thermal interface material according to claim 1, wherein the graphite film has a density of 1.70 g/cm³ or more and 2.26 g/cm³ or less, and a thermal conductivity of 1000 W/mK to 2000 W/mK in a film plane direction.

4. The thermal interface material according to claim 1, wherein a ratio $R_{0.1P}/R_{0.45P}$ of a thermal resistance $R_{0.1P}$ on a load of 0.1 MPa to a thermal resistance $R_{0.45P}$ on a load of 0.45 MPa of the thermal interface material is 1.0 to 1.8.

5. A method for thermally coupling materials with the thermal interface material according to claim 1, wherein a thermal resistance of the thermal interface material is 0.3° C.·cm²/W or less on a load of 0.1 MPa.

6. A method for thermally coupling materials with the thermal interface material according to claim 1, wherein a ratio $R_{0.1P}/R_{0.45P}$ of a thermal resistance $R_{0.1P}$ on a load of 0.1 MPa to a thermal resistance $R_{0.45P}$ on a load of 0.45 MPa of the thermal interface material is 1.0 to 1.8.

7. A method for preparing the thermal interface material according to claim 1, comprising carbonizing a polymer film to form a carbonized film, and graphitizing the carbonized film to form a graphite film.

8. The method according to claim 7, wherein in at least of the carbonizing step and the graphitizing step, the polymer film, the carbonized film, or the graphite film is supported at multiple points, and the polymer film, the carbonized film, or the graphite film is carbonized and/or graphitized while pressing.

9. The method according to claim 8, wherein in at least one of the carbonizing step and the graphitizing step, a spacer is laminated on each plane of the polymer film, the carbonized film, or the graphite film, and a laminate of the spacer and the polymer film, the carbonized film, or the graphite film is carbonized and/or graphitized while pressing.

10. The method according to claim 9, wherein the spacer has a surface roughness Ra of 0.2 μm to 20 μm.

11. The method according to claim 10, wherein the spacer comprises a felt composed of a carbon fiber or a graphite fiber.

12. The method according to claim 9, wherein the spacer comprises a felt composed of a carbon fiber or a graphite fiber.

13. The method according to claim 7, wherein the polymer film comprises a condensed aromatic polymer.

14. The method according to claim 7, comprising carbonizing and graphitizing the polymer film at a temperature of 2400° C. or more, wherein the polymer film comprises an aromatic polyimide and has a thickness of 300 nm to 7.5 μm.

15. A method for thermally coupling materials with the thermal interface material according to claim 2, wherein a thermal resistance of the thermal interface material is 0.3° C.·cm²/W or less on a load of 0.1 MPa.

16. A method for thermally coupling materials with the thermal interface material according to claim 2, wherein a ratio $R_{0.1P}/R_{0.45P}$ of a thermal resistance $R_{0.1P}$ on a load of 0.1 MPa to a thermal resistance $R_{0.45P}$ on a load of 0.45 MPa of the thermal interface material is 1.0 to 1.8.

17. A thermal interface material for transferring heat by interposing between two materials, wherein:
    the thermal interface material comprises a graphite film,
    the graphite film has a thickness T of 200 nm to 3 μm and a density of 1.70 g/cm³ or more,
    each of the arithmetic average roughness Ra is 0.3 μm to 6.0 μm on a surface of the graphite film,
    a ratio Ra/T of an arithmetic average roughness Ra on a surface of the graphite film to the thickness T of the graphite film is 0.1 to 30, and
    a ratio $R_{0.1P}/R_{0.45P}$ of a thermal resistance $R_{0.1P}$ on a load of 0.1 MPa to a thermal resistance $R_{0.45P}$ on a load of 0.45 MPa of the thermal interface material is 1.0 to 1.8.

18. The thermal interface material according to claim 17, wherein a ratio Ra/Rave of each of the arithmetic average roughnesses Ra on two or more parts of the graphite film to an average Rave of the arithmetic average roughnesses Ra is 0.2 to 5.0.

19. The thermal interface material according to claim 17, wherein the graphite film has a density of 1.70 g/cm³ or more and 2.26 g/cm³ or less, and a thermal conductivity of 1000 W/mK to 2000 W/mK in a film plane direction.

20. The thermal interface material according to claim 17, wherein a thermal resistance of the thermal interface material is 0.3° C.·cm²/W or less on a load of 0.1 MPa.

* * * * *